(12) United States Patent
Lee et al.

(10) Patent No.: US 7,897,954 B2
(45) Date of Patent: Mar. 1, 2011

(54) DIELECTRIC-SANDWICHED PILLAR MEMORY DEVICE

(75) Inventors: Ming-Hsiu Lee, Hsinchu (TW); Chieh-Fang Chen, Banciao (TW)

(73) Assignee: Macronix International Co., Ltd., Hsinchu (TW)

( * ) Notice: Subject to any disclaimer, the term of this patent is extended or adjusted under 35 U.S.C. 154(b) by 164 days.

(21) Appl. No.: 12/249,178

(22) Filed: Oct. 10, 2008

(65) Prior Publication Data

US 2010/0091558 A1    Apr. 15, 2010

(51) Int. Cl.
*H01L 47/00* (2006.01)
*H01L 21/06* (2006.01)

(52) U.S. Cl. .................. 257/2; 257/4; 438/102

(58) Field of Classification Search ............. 438/3, 102, 438/103; 257/295, 2, 4; 365/171, 173
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,406,509 A | 4/1995 | Ovshinsky et al. | |
| 5,515,488 A | 5/1996 | Hoppe et al. | |
| 5,534,711 A | 7/1996 | Ovshinsky et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |
| 5,716,883 A | 2/1998 | Tseng et al. | |

(Continued)

FOREIGN PATENT DOCUMENTS

WO    0079539    12/2000

(Continued)

OTHER PUBLICATIONS

"Magnetic Bit Boost," www.sciencenews.org, Dec. 18 & 25, 2004, p. 389, vol. 166.

(Continued)

*Primary Examiner* — Kevin M Picardat
(74) *Attorney, Agent, or Firm* — James F. Hann; Haynes Beffel & Wolfeld LLP

(57) ABSTRACT

A memory device includes bottom and top electrode structures and a memory cell therebetween. The memory cell comprises bottom and top memory elements and a dielectric element therebetween. A lower resistance conduction path is formed through the dielectric element. The dielectric element may have an outer edge and a central portion, the outer edge being thicker than the central portion. To make a memory device, an electrical pulse is applied through the memory cell to form a conduction path through the dielectric element. A passivation element may be formed by oxidizing the outer surface of the memory cell which may also enlarge the outer edge of the dielectric element.

19 Claims, 4 Drawing Sheets

U.S. PATENT DOCUMENTS

| | | | |
|---|---|---|---|
| 5,754,472 A | 5/1998 | Sim et al. | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,923,583 A * | 7/1999 | Womack | 365/171 |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan et al. | |
| 6,025,220 A | 2/2000 | Sandhu | |
| 6,031,287 A | 2/2000 | Harshfield | |
| 6,034,882 A | 3/2000 | Johnson et al. | |
| 6,046,951 A | 4/2000 | El Hajji et al. | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung et al. | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,704,235 B2 | 3/2004 | Knall et al. | |
| 6,707,711 B2 * | 3/2004 | Saito et al. | 365/158 |
| 6,744,088 B1 | 6/2004 | Dennison | |
| 6,750,079 B2 | 6/2004 | Lowrey et al. | |
| 6,750,101 B2 | 6/2004 | Lung et al. | |
| 6,768,665 B2 | 7/2004 | Parkinson et al. | |
| 6,784,028 B2 | 8/2004 | Rueckes et al. | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,805,563 B2 | 10/2004 | Ohashi et al. | |
| 6,815,704 B1 | 11/2004 | Chen | |
| 6,836,424 B2 | 12/2004 | Segal et al. | |
| 6,838,692 B1 | 1/2005 | Lung et al. | |
| 6,841,794 B2 | 1/2005 | Chen et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung et al. | |
| 6,867,638 B2 | 3/2005 | Saiki et al. | |
| 6,881,603 B2 | 4/2005 | Lai | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,911,682 B2 | 6/2005 | Rueckes et al. | |
| 6,919,592 B2 | 7/2005 | Segal et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,961,277 B2 | 11/2005 | Moore et al. | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,979,590 B2 | 12/2005 | Rueckes et al. | |
| 6,982,903 B2 | 1/2006 | Bertin et al. | |
| 6,992,932 B2 | 1/2006 | Cohen et al. | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 | 5/2006 | Kang et al. | |
| 7,042,001 B2 | 5/2006 | Kim et al. | |
| 7,056,758 B2 | 6/2006 | Segal et al. | |
| 7,061,800 B2 | 6/2006 | Ooiishi et al. | |
| 7,067,864 B2 | 6/2006 | Nishida et al. | |
| 7,067,865 B2 | 6/2006 | Lung et al. | |
| 7,078,273 B2 | 7/2006 | Matsuoka et al. | |
| 7,105,408 B2 | 9/2006 | Dennison | |
| 7,112,493 B2 | 9/2006 | Bertin et al. | |
| 7,115,901 B2 | 10/2006 | Bertin et al. | |
| 7,115,927 B2 | 10/2006 | Hideki et al. | |
| 7,120,047 B2 | 10/2006 | Segal et al. | |
| 7,122,281 B2 | 10/2006 | Pierrat | |
| 7,122,824 B2 | 10/2006 | Khouri et al. | |
| 7,126,149 B2 | 10/2006 | Iwasaki et al. | |
| 7,132,350 B2 | 11/2006 | Yeh et al. | |
| 7,132,675 B2 | 11/2006 | Gilton | |
| 7,133,086 B2 | 11/2006 | Toyota et al. | |

| | | | | | |
|---|---|---|---|---|---|
| 7,154,774 B2 | 12/2006 | Bedeschi et al. | 2006/0110888 A1 | 5/2006 | Cho et al. |
| 7,161,218 B2 | 1/2007 | Bertin et al. | 2006/0113521 A1 | 6/2006 | Lung |
| 7,164,147 B2 | 1/2007 | Lee et al. | 2006/0118913 A1 | 6/2006 | Yi et al. |
| 7,166,533 B2 | 1/2007 | Happ | 2006/0124916 A1 | 6/2006 | Lung |
| 7,169,635 B2 | 1/2007 | Kozicki | 2006/0126395 A1 | 6/2006 | Chen et al. |
| 7,176,505 B2 | 2/2007 | Rueckes et al. | 2006/0131555 A1 | 6/2006 | Liu et al. |
| 7,202,493 B2 | 4/2007 | Lung et al. | 2006/0138467 A1 | 6/2006 | Lung |
| 7,203,112 B2 | 4/2007 | Liaw et al. | 2006/0154185 A1 | 7/2006 | Ho et al. |
| 7,208,751 B2 | 4/2007 | Ooishi et al. | 2006/0157681 A1 | 7/2006 | Chen et al. |
| 7,211,854 B2 | 5/2007 | Bertin et al. | 2006/0163553 A1 | 7/2006 | Liang |
| 7,214,958 B2 | 5/2007 | Happ | 2006/0163554 A1 | 7/2006 | Lankhorst et al. |
| 7,220,983 B2 | 5/2007 | Lung | 2006/0198183 A1 | 9/2006 | Kawahara et al. |
| 7,229,883 B2 | 6/2007 | Wang et al. | 2006/0205108 A1 | 9/2006 | Maimon et al. |
| 7,238,994 B2 | 7/2007 | Chen et al. | 2006/0211165 A1 | 9/2006 | Hwang et al. |
| 7,248,494 B2 | 7/2007 | Oh et al. | 2006/0216877 A1 | 9/2006 | Toyota et al. |
| 7,251,157 B2 | 7/2007 | Osada et al. | 2006/0226409 A1 | 10/2006 | Burr et al. |
| 7,253,429 B2 | 8/2007 | Klersy et al. | 2006/0234138 A1 | 10/2006 | Fehlhaber et al. |
| 7,269,052 B2 | 9/2007 | Segal et al. | 2006/0244047 A1 | 11/2006 | Gopalakrishnan et al. |
| 7,272,037 B2 | 9/2007 | Lee et al. | 2006/0284157 A1 | 12/2006 | Chen et al. |
| 7,277,317 B2 | 10/2007 | Le Phan et al. | 2006/0284158 A1 | 12/2006 | Lung et al. |
| 7,291,556 B2 | 11/2007 | Choi et al. | 2006/0284214 A1 | 12/2006 | Chen |
| 7,309,630 B2 | 12/2007 | Fan et al. | 2006/0284279 A1 | 12/2006 | Lung et al. |
| 7,321,130 B2 | 1/2008 | Lung et al. | 2006/0286709 A1 | 12/2006 | Lung et al. |
| 7,323,708 B2 | 1/2008 | Lee et al. | 2006/0286743 A1 | 12/2006 | Lung et al. |
| 7,332,370 B2 | 2/2008 | Chang et al. | 2006/0289848 A1 | 12/2006 | Dennison |
| 7,336,526 B2 | 2/2008 | Osada et al. | 2007/0008786 A1 | 1/2007 | Scheuerlein |
| 7,351,648 B2 | 4/2008 | Furukawa et al. | 2007/0030721 A1 | 2/2007 | Segal et al. |
| 7,359,231 B2 | 4/2008 | Venkataraman et al. | 2007/0037101 A1 | 2/2007 | Morioka |
| 7,364,935 B2 | 4/2008 | Lung et al. | 2007/0040159 A1 | 2/2007 | Wang |
| 7,365,385 B2 | 4/2008 | Abbott | 2007/0063180 A1 | 3/2007 | Asano et al. |
| 7,379,328 B2 | 5/2008 | Osada et al. | 2007/0096162 A1 | 5/2007 | Happ et al. |
| 7,385,235 B2 | 6/2008 | Lung et al. | 2007/0108077 A1 | 5/2007 | Lung et al. |
| 7,394,088 B2 | 7/2008 | Lung | 2007/0108429 A1 | 5/2007 | Lung |
| 7,397,060 B2 | 7/2008 | Lung | 2007/0108430 A1 | 5/2007 | Lung |
| 7,423,300 B2 | 9/2008 | Lung et al. | 2007/0108431 A1 | 5/2007 | Chen et al. |
| 7,426,134 B2 | 9/2008 | Happ et al. | 2007/0109836 A1 | 5/2007 | Lung |
| 7,449,710 B2 | 11/2008 | Lung | 2007/0109843 A1 | 5/2007 | Lung et al. |
| 7,473,597 B2 | 1/2009 | Lee et al. | 2007/0111429 A1 | 5/2007 | Lung |
| 7,482,660 B2 * | 1/2009 | Osari .......................... 257/393 | 2007/0115794 A1 | 5/2007 | Lung |
| 7,485,891 B2 | 2/2009 | Hamann et al. | 2007/0117315 A1 | 5/2007 | Lai et al. |
| 2002/0070457 A1 | 6/2002 | Sun et al. | 2007/0121363 A1 | 5/2007 | Lung |
| 2002/0113273 A1 | 8/2002 | Hwang et al. | 2007/0121374 A1 | 5/2007 | Lung et al. |
| 2002/0154252 A1 | 10/2002 | Toyota et al. | 2007/0126040 A1 | 6/2007 | Lung |
| 2003/0072195 A1 | 4/2003 | Mikolajick | 2007/0131922 A1 | 6/2007 | Lung |
| 2003/0095426 A1 | 5/2003 | Hush et al. | 2007/0138458 A1 | 6/2007 | Lung |
| 2003/0186481 A1 | 10/2003 | Lung | 2007/0147105 A1 | 6/2007 | Lung et al. |
| 2004/0026686 A1 | 2/2004 | Lung | 2007/0153563 A1 | 7/2007 | Nirschl |
| 2004/0051094 A1 | 3/2004 | Ooishi | 2007/0154847 A1 | 7/2007 | Chen et al. |
| 2004/0113135 A1 | 6/2004 | Wicker | 2007/0155172 A1 | 7/2007 | Lai et al. |
| 2004/0159829 A1 | 8/2004 | Chen et al. | 2007/0158632 A1 | 7/2007 | Ho |
| 2004/0165422 A1 | 8/2004 | Hideki et al. | 2007/0158633 A1 | 7/2007 | Lai et al. |
| 2004/0233748 A1 | 11/2004 | Terao et al. | 2007/0158645 A1 | 7/2007 | Lung |
| 2004/0248339 A1 | 12/2004 | Lung | 2007/0158690 A1 | 7/2007 | Ho et al. |
| 2004/0256610 A1 | 12/2004 | Lung | 2007/0158862 A1 | 7/2007 | Lung |
| 2005/0007852 A1 | 1/2005 | Moore et al. | 2007/0161186 A1 | 7/2007 | Ho |
| 2005/0018526 A1 | 1/2005 | Lee | 2007/0173019 A1 | 7/2007 | Ho et al. |
| 2005/0029502 A1 | 2/2005 | Hudgens | 2007/0173063 A1 | 7/2007 | Lung |
| 2005/0062087 A1 | 3/2005 | Chen et al. | 2007/0176261 A1 | 8/2007 | Lung |
| 2005/0063223 A1 * | 3/2005 | Tran .......................... 365/171 | 2007/0187664 A1 | 8/2007 | Happ |
| 2005/0093022 A1 | 5/2005 | Lung | 2007/0201267 A1 | 8/2007 | Happ et al. |
| 2005/0122775 A1 | 6/2005 | Koyanagi et al. | 2007/0215852 A1 | 9/2007 | Lung |
| 2005/0127349 A1 | 6/2005 | Horak et al. | 2007/0222723 A1 | 9/2007 | Sugita et al. |
| 2005/0145984 A1 | 7/2005 | Chen et al. | 2007/0224726 A1 | 9/2007 | Chen et al. |
| 2005/0158950 A1 | 7/2005 | Scheuerlein et al. | 2007/0235811 A1 | 10/2007 | Furukawa et al. |
| 2005/0191804 A1 | 9/2005 | Lai et al. | 2007/0236989 A1 | 10/2007 | Lung |
| 2005/0201146 A1 | 9/2005 | Moore et al. | 2007/0246699 A1 | 10/2007 | Lung |
| 2005/0201182 A1 | 9/2005 | Osada et al. | 2007/0249083 A1 | 10/2007 | Li et al. |
| 2005/0212024 A1 | 9/2005 | Happ | 2007/0249090 A1 | 10/2007 | Philipp et al. |
| 2005/0212026 A1 | 9/2005 | Chung et al. | 2007/0257300 A1 | 11/2007 | Ho et al. |
| 2005/0215009 A1 | 9/2005 | Cho | 2007/0262388 A1 | 11/2007 | Ho et al. |
| 2006/0006472 A1 | 1/2006 | Jiang | 2007/0274121 A1 | 11/2007 | Lung et al. |
| 2006/0038221 A1 | 2/2006 | Lee et al. | 2007/0285960 A1 | 12/2007 | Lung et al. |
| 2006/0066156 A1 | 3/2006 | Dong et al. | 2007/0298535 A1 | 12/2007 | Lung |
| 2006/0073642 A1 | 4/2006 | Yeh et al. | 2008/0006811 A1 | 1/2008 | Philipp et al. |
| 2006/0073655 A1 | 4/2006 | Dennison | 2008/0012000 A1 | 1/2008 | Harshfield |
| 2006/0091476 A1 | 5/2006 | Pinnow et al. | 2008/0014676 A1 | 1/2008 | Lung et al. |
| 2006/0094154 A1 | 5/2006 | Lung | 2008/0025089 A1 | 1/2008 | Scheuerlein et al. |
| 2006/0108667 A1 | 5/2006 | Lung | 2008/0043520 A1 | 2/2008 | Chen |
| 2006/0110878 A1 | 5/2006 | Lung et al. | 2008/0094871 A1 | 4/2008 | Parkinson |

| | | | |
|---|---|---|---|
| 2008/0101110 | A1 | 5/2008 | Happ et al. |
| 2008/0137400 | A1 | 6/2008 | Chen et al. |
| 2008/0164453 | A1 | 7/2008 | Breitwisch et al. |
| 2008/0165569 | A1 | 7/2008 | Chen et al. |
| 2008/0165570 | A1 | 7/2008 | Happ et al. |
| 2008/0165572 | A1 | 7/2008 | Lung |
| 2008/0166875 | A1 | 7/2008 | Lung |
| 2008/0179582 | A1 | 7/2008 | Burr et al. |
| 2008/0180990 | A1 | 7/2008 | Lung |
| 2008/0186755 | A1 | 8/2008 | Lung et al. |
| 2008/0191187 | A1 | 8/2008 | Lung et al. |
| 2008/0192534 | A1 | 8/2008 | Lung |
| 2008/0197334 | A1 | 8/2008 | Lung |
| 2008/0224119 | A1 | 9/2008 | Burr et al. |
| 2008/0225489 | A1 | 9/2008 | Cai et al. |
| 2010/0193763 | A1 | 8/2010 | Chen et al. |

FOREIGN PATENT DOCUMENTS

| | | |
|---|---|---|
| WO | 0145108 | 6/2001 |
| WO | 0225733 | 3/2002 |

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, pp. 1-6.
Bedeschi, F. et al., "4-Mb MOSFET-Selected Phase-Change Memory Experimental Chip," IEEE, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, AN et al., "Non-Volatile Resistive Switching for Advanced Memory Applications," IEEE IEDM, Dec. 5-7 2005, 4 pp.
Cho, S. L. et al., "Highly Scalable On-axis Confined Cell Structure for High Density PRAM beyond 256Mb," 2005 Symposium on VLSI Technology Digest of Technical Papers, pp. 96-97.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Ha, Y. H. et al., "An Edge Contact Type Cell fro Phase Change RAM Featuring Very Low Power Consumption," 2003 Symposium on VLSI Technology Digest of Technical Papers, pp. 175-176.
Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., "OUM-A 180 nm Nonvolatile Memory Cell Element Technology for Stand Alone and Embedded Applications," IEEE IEDM 2001, pp. 803-806.
Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Mott, Nevill, "Electrons in Glass," Nobel Lecture, Dec. 8, 1977, Physics, 1977, pp. 403-413.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.
Pirovano, Agostino et al.,"Reliability Study of Phase-Change Nonvolatile Memories," IEEE Transactions on Device and Materials Reliability, Sep. 2004, pp. 422-427, vol. 4, No. 3.
Prakash, S. et al., "A guideline for Designing Chalcogenide-Based Glasses for Threshold Switching Characteristics," IEEE Electron Device Letters, vol. 18, No. 2, Feb. 1997, pp. 45-47.
Radaelli, A. et al., "Electronic Switching Effect and Phase-Change Transition in Chalcogenide Materials," IEEE Electron Device Letters, Oct. 2004, pp. 684-686, vol. 25, No. 10.
Rochefort, C. et al., "Manufacturing of High Aspect-Ration p-n Junctions Using Vapor Phase Doping for Application in Multi-Resurf Devices," IEEE 2002, pp. 237-240.
Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.
Strauss, Karl F. et al., "Overview of Radiation Tolerant Unlimited Write Cycle Non-Volatile Memory," IEEE 2000, pp. 399-408.
Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.Pdf#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Yamada, Noboru, "Potential of Ge-Sb-Te phase-change optical disks for high-data-rate recording in the near future," (Conference Proceedings Paper), Jul. 30, 1997, vol. 3109, 10 pages.

Gleixner, "Phase Change Memory Reliability", 22nd NVSMW, Aug. 26, 2007, 46 pages.

* cited by examiner

US 7,897,954 B2

DIELECTRIC-SANDWICHED PILLAR MEMORY DEVICE

PARTIES TO A JOINT RESEARCH AGREEMENT

International Business Machines Corporation, a New York corporation; Macronix International Corporation, Ltd., a Taiwan corporation, and Infineon Technologies AG, a German corporation, are parties to a Joint Research Agreement.

BACKGROUND OF THE INVENTION

1. Field of the Invention

The present invention relates to high density memory devices based on phase change based memory materials, including chalcogenide based materials and other programmable resistive materials, and the methods for manufacturing such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state. It is desirable to minimize the magnitude of the reset current used to cause transition of phase change material from the crystalline state to the amorphous state.

The magnitude of the current needed for reset can be reduced by reducing the size of the phase change material element in the cell and/or the contact area between electrodes and the phase change material, such that higher current densities are achieved with small absolute current values through the phase change material element.

One approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064 issued Aug. 6, 2002 to Wicker, "Reduced Contact Areas of Sidewall Conductor"; U.S. Pat. No. 6,462,353 issued Oct. 8, 2002 to Gilgen, "Method for Fabricating a Small Area of Contact Between Electrodes"; U.S. Pat. No. 6,501,111 issued Dec. 31, 2002 to Lowrey, "Three-Dimensional (3D) Programmable Device"; U.S. Pat. No. 6,563,156 issued Jul. 1, 2003 to Harshfield, "Memory Elements and Methods for Making Same."

Problems have arisen in manufacturing devices with very small dimensions, and with variations in manufacturing processes needed to meet the tight tolerance requirements necessary for large-scale high-density memory devices.

Another conventional approach for reducing the amount of current necessary is to reduce the size of the phase change cell. However, this approach has problems because of the difficulty making every cell the same size, which is necessary for the cells to operate in a uniform manner. Another approach is to limit the heat dissipation from the phase change material. Success using this approach has also proven somewhat difficult to achieve because the commonly used metal electrodes are not only good electrical conductors but also good heat conductors.

It is therefore desirable to provide memory device constructed for low current operation while facilitating manufacturing, and methods for manufacturing such devices.

SUMMARY OF THE INVENTION

An example of a memory device includes bottom and top electrode structures and a memory cell therebetween. The memory cell comprises a bottom memory element comprising a bottom memory material switchable between electrical properties states by the application of energy, a top memory element comprising a top memory material switchable between electrical properties states by the application of energy, and a dielectric element therebetween. The dielectric element comprises a conduction path formed therethrough connecting the top and bottom memory elements. The portion of the dielectric element surrounding the conduction path has an electrical resistance greater than the electrical resistance of the conduction path. In some examples the bottom and top memory elements comprise different memory materials. In some examples each of the top and bottom memory elements comprises GST and the dielectric element comprises $Ge_xO_y$, or $SiO_x$. In some examples the memory cell has an outer surface extending between the bottom and top electrode structures, the outer surface comprising a passivation element. In some examples the dielectric element has an outer edge and a central portion, the outer edge being thicker than the central portion.

One example of a method for making a memory device comprises forming bottom and top electrode structures and a memory cell therebetween. The memory cell comprises bottom and top memory elements and a dielectric element therebetween. An electrical breakdown procedure is performed on the dielectric element by applying an electrical pulse through the memory cell to form a conduction path through the dielectric element. Some examples comprise using different memory materials for the bottom and top memory elements. Some examples comprise forming a passivation element surrounding an outer surface of the memory cell. In some examples the passivation element may be created by oxidizing the outer surface. In some examples oxidizing the outer surface enlarges the outer edge of the dielectric element so that the outer edge is thicker than the central portion.

An example of an integrated circuit comprises a memory array and control circuitry. The memory array comprises a plurality of memory devices. At least some of the memory devices comprise a memory cell. The memory cell comprises a bottom memory element, top memory element, and a dielectric element between the bottom and top memory elements. The control circuitry is adapted to apply an electrical pulse through the memory cell during an electrical breakdown procedure to form a conduction path through the dielectric element connecting the top and bottom memory elements of at least some of the memory devices. The portion of the dielectric element surrounding the conduction path has an electrical resistance greater than the electrical resistance of the conduction path. In some examples at least of some of the memory devices further comprise a passivation element surrounding the memory cell. In some examples the conduction path is an electrical-pulse-formed conduction path. In some examples the dielectric element has an outer edge and a central portion, the outer edge being thicker than the central portion.

Other aspects and advantages of the present invention can be seen on review of the drawings, the detailed description and the claims, which follow.

BRIEF DESCRIPTION OF THE DRAWINGS

FIG. 3 shows a first dielectric layer, including bottom electrode, on which a first memory element layer, a dielectric layer, a second memory element layer, and a cap layer have been formed;

FIG. 4 shows the result of having created pillars of material surrounded by a dielectric layer with top electrodes formed thereon from the structure of FIG. 3;

FIG. 5 shows a structure of FIG. 4 after an electrical breakdown procedure has been performed to create conduction paths through the dielectric layers;

DETAILED DESCRIPTION

Figure 1:
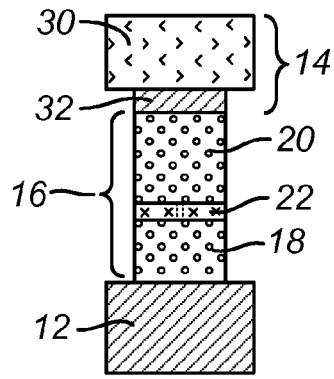
FIG. 1 illustrates a simplified cross-sectional view of a memory device made according to the invention.

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations in the description that follows. Like elements in various embodiments are commonly referred to with like reference numerals.

Figure 2:
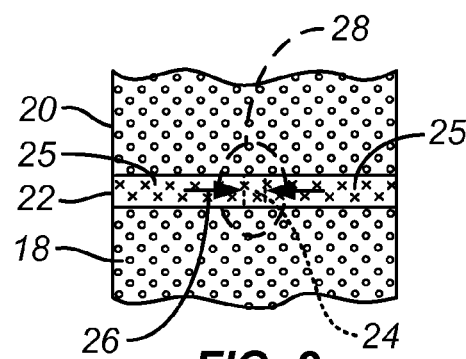
FIG. 2 is an enlarged view of a portion of the device of FIG. 1 showing a conduction path through the dielectric element and the transition areas in the bottom and top memory elements.

FIG. 1 illustrates one example of a memory device 10 made according to the invention. Device 10 includes a bottom electrode structure 12, a top electrode structure 14 and a memory cell 16 therebetween. Memory cell 16 includes a bottom memory element 18, a top memory element 20 and a dielectric element 22 therebetween. Bottom and top memory elements comprise bottom and top memory materials respectively. The memory materials are switchable between electrical properties states by the application of energy. As shown best in FIG. 2, dielectric element 22 has a low electrical resistance conduction path 24 formed therethrough connecting bottom and top memory elements 18, 20. Conduction path 24 preferably has an electrical resistance less than the resistance of the remainder 25 of dielectric element 22. The dielectric element 22 can be silicon oxide or germanium oxide. Other dielectric materials, such as silicon nitride, may be used for element 22 so long as they have appropriate electrical breakdown characteristics. The creation of conduction path 24 is discussed below.

Dielectric element 22 preferably has a thickness of about 1 to 30 nm, and typically about 5 nm. Because of the small diameter or thinness of conduction path 24, the current required to transition the memory material in transition areas 28 is greatly reduced from that which would be required in the absence of dielectric element 22 with its conduction path 24.

In one example bottom electrode structure 12 is a plug type bottom electrode. In the example of FIG. 1, top electrode structure 14 comprises a top electrode 30 and an optional protective cap layer 32. Cap layer 32 is typically made of titanium nitride. In this example the memory materials from which bottom and top memory elements 18, 20 are made may be the same or different memory materials. For example, elements 18, 20 can both be a phase change type of resistive memory material, such as GST (Ge Sb Te alloy), in particular $Ge_2Sb_2Te_5$, and dielectric element 22 can be $Ge_xO_y$. In some situations it may be desired to use GST for both bottom and top memory element elements 18, 20 but dope one or both of the elements so that they have different phase change transition properties. This may be desired when it is desired to create a transition area 28 within only one of the bottom and top memory elements 18, 20 in some cases or all situations.

The bottom electrode structure 12 and a top electrode 30 may comprise, for example, tungsten, TiN or TaN. TiN may be preferred for bottom electrode structure 12 in embodiments in which the memory element in bottom memory element 18 comprises GST (discussed below) because it makes good contact with GST, it is a common material used in semiconductor manufacturing, and it provides a good diffusion barrier at the higher temperatures at which GST transitions, typically in the 600-700° C. range. Alternatively, bottom electrode structure 12 may be TiAlN or TaAlN, or may comprise, for further examples, one or more elements selected from the group consisting of Ti, W, Mo, Al, Ta, Cu, Pt, Ir, La, Ni, N, O, and Ru and combinations thereof.

Figure 3:
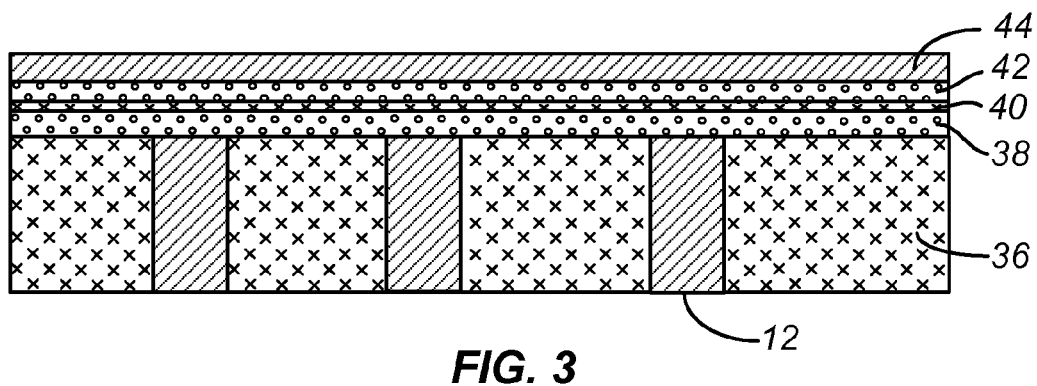
FIGS. 3-5 illustrate exemplary structures resulting from a procedure for making the memory device of FIG. 1.
Figure 4:
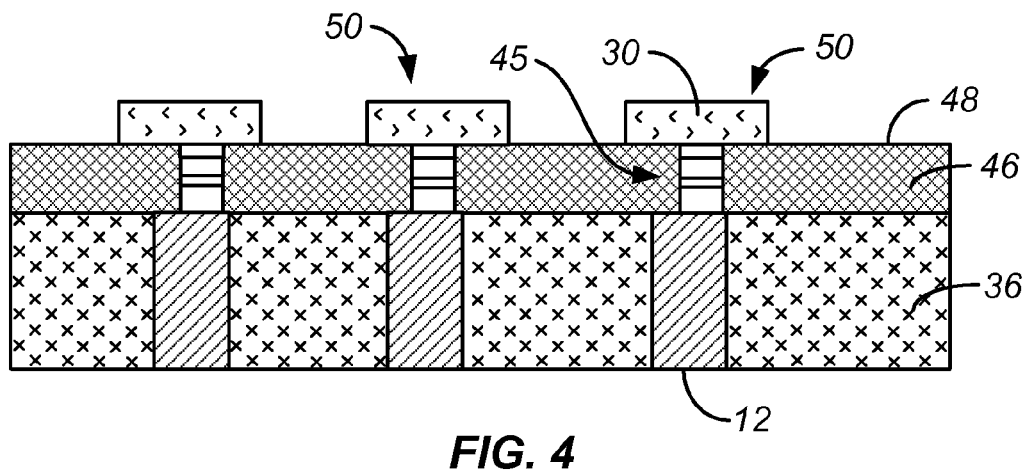
Figure 5:
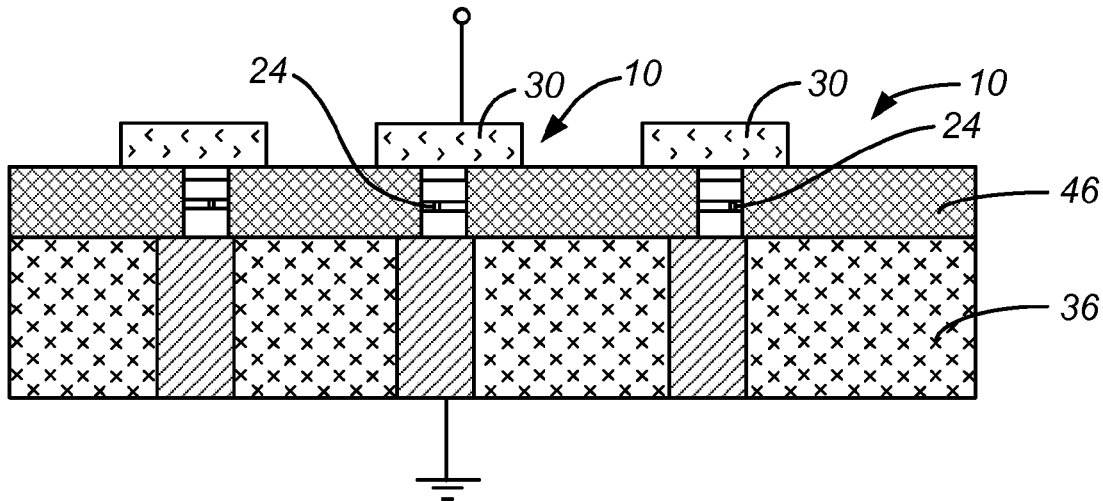

FIGS. 3-5 illustrate procedures for making memory device 10 of FIG. 1. In one example bottom electrode structures 12 are formed in a first dielectric layer 36 followed by the deposition of: a first memory element layer 38 such as by a thin film deposition technique, a layer 40 of dielectric such as by co-sputtering of GST and oxygen, or by GeO sputtering, or by $SiO_2$ sputtering, then a second memory element layer 42 such as by a thin film deposition technique, and an optional cap layer 44. The structure of FIG. 3 is then transformed into the structure of FIG. 4 such as by using a mask in removing portions of layers 38, 40, 42 and 44 to leave pillars 45 of material. Pillars 45 will be used as the basis for the memory cell 16 and cap layer 32 elements of FIG. 1. This is followed by depositing a second dielectric layer 46 to surround pillars 45 and planarization of the resulting structure to create the planarized surface 48 of FIG. 4. Top electrodes 30 are then formed on surface 48 to create subassemblies 50. Thereafter an electrical breakdown procedure is performed by applying electrical pulse through pillars 45 of material to form conduction paths 24 thereby creating memory devices 10. In one exemplary procedure, an electrical pulse having a peak aptitude of 5 volts and a duration of 50 nano seconds was applied to top electrodes 30 as indicated in FIG. 5 to form conduction paths 24. The formation of conduction paths by creation of electrical breakdown paths in a dielectric layer is known. See, for example, the Background sections of U.S. Pat. Nos. 6,704,235 and 7,130,350.

Several additional advantages accrue through the use of the present invention. Because dielectric element 22 is sandwiched between the relatively poor thermally conductive memory elements 18, 20, heat dissipation away from transition areas 28 is suppressed to reduce the current requirement during set and reset operations. The invention provides good critical dimension (CD) control; by controlling the electrical breakdown procedure, for example the waveform and magnitude of a current pulse, the uniformity and reliability of conduction path 24 can be controlled. The width of memory cell 16 and the size of the bottom electrode 12 are not critical and can be relatively large because with this cell structure the operating current will be decided by the size of conduction path 24, while the size of the conduction path 24 is defined by the electrical breakdown procedure. Conduction path 24 is self aligning, thus simplifying manufacturing, because it is formed by the electrical pulse applied during the electrical breakdown procedure. Lower operating currents for both set and reset operations are due to both the thin conduction path and the heating efficiency created by the conduction path being between memory elements 18, 20, both low thermally conductive materials.

Figure 6:
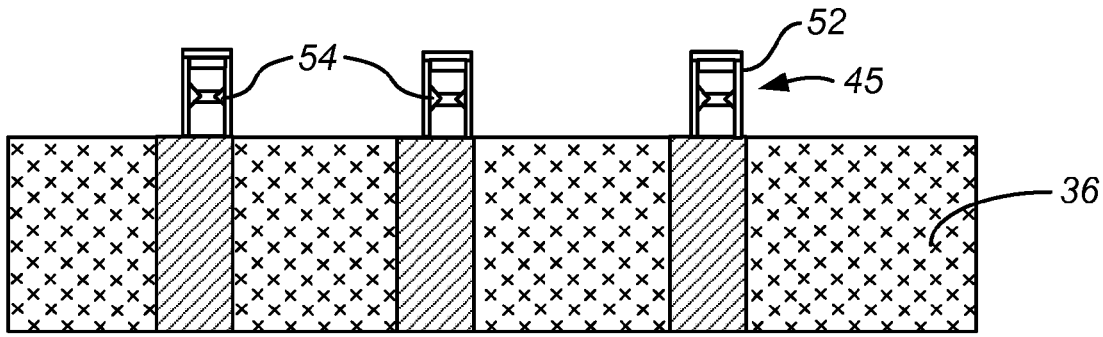
FIGS. 6 and 7 represent structures created during construction of an alternative embodiment of the invention in which a passivation element surrounds the pillars of material to help protect the outer surface of the memory cell.
Figure 7:
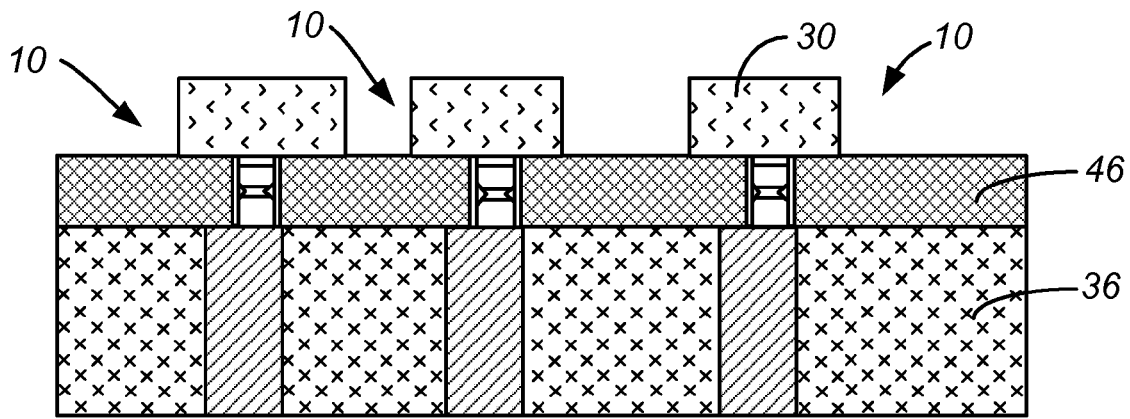
Figure 8:
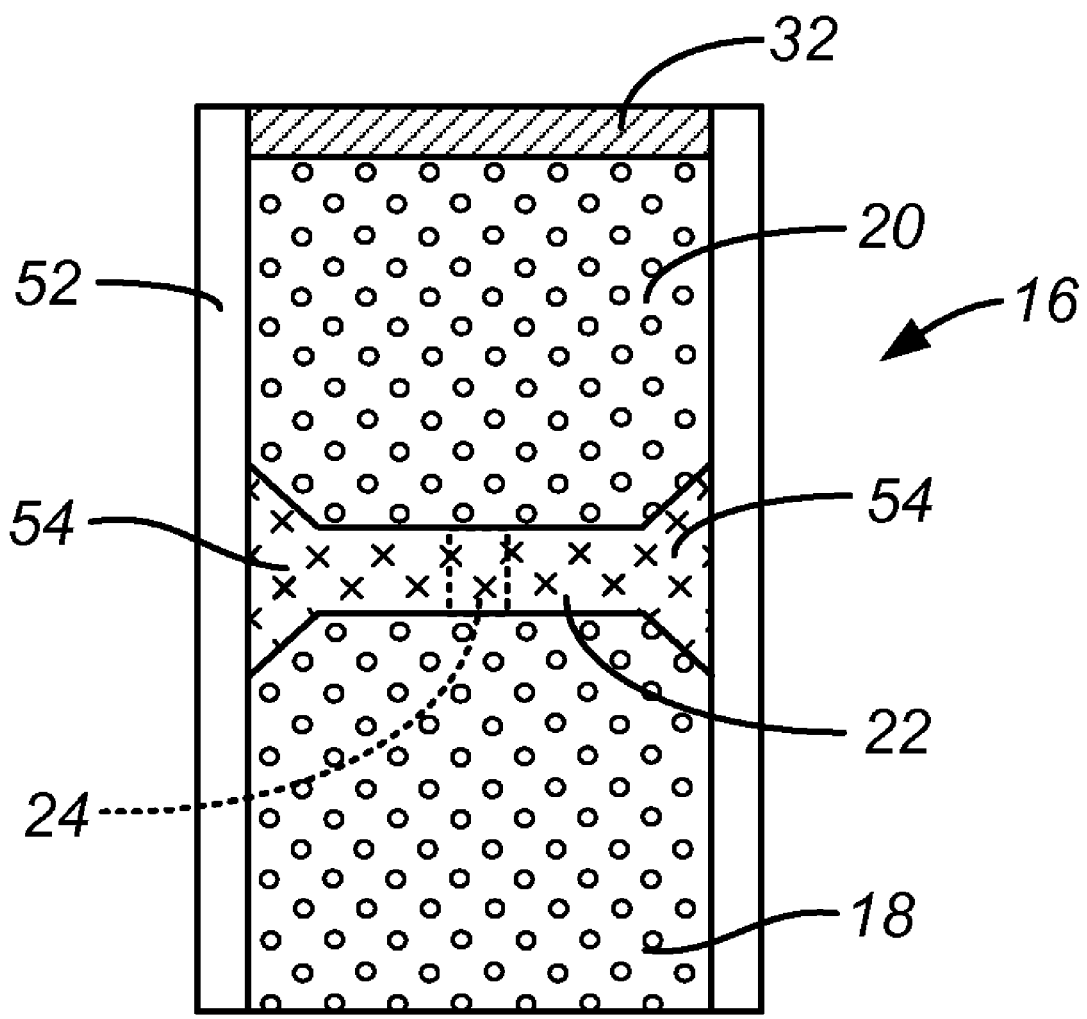
FIG. 8 is an enlarged view of the memory cell of FIG. 7 better illustrating the enlarged edges of the dielectric layer.

FIGS. 6-8 represent steps in the construction of an alternative embodiment of the invention. In this example after pillars 45 of material are formed, a passivation process is used to surround pillars 45 with a passivation element 52. One way to do so is to use oxygen plasma to oxidize the outer surface of pillar 45, which also enhances, that is enlarges, the edge 54 of dielectric element 22. Enlarged edge 54 is seen best in FIG. 8. The remaining steps are essentially the same as discussed above with regard to FIGS. 3-5 with the structure of FIG. 7 corresponding to the structure of FIG. 4. The planarization step removes the portion of passivation element 52 covering cap layer 32. Thereafter an electrical breakdown procedure is performed to create conduction paths 24. In this example passivation element 52 can help protect the outer surface of memory cell 16 and helps to ensure that conduction path 24 will be spaced apart from edge 54 of dielectric element 22 because edge 54 is thicker than the central portion of dielectric element 22 after the oxidizing step; therefore the electrical breakdown will not occur at the enlarged edge 54 but rather towards the center of dielectric element 22. This can be important because the composition of the phase change material may be changed at the outer surface of pillar 45 during the etching process to make the pillar. The thicker edge 54 of dielectric element 22 will keep the conduction path 24 away from the outer surface of pillar 45, thus improving the device characteristics.

Figure 9:
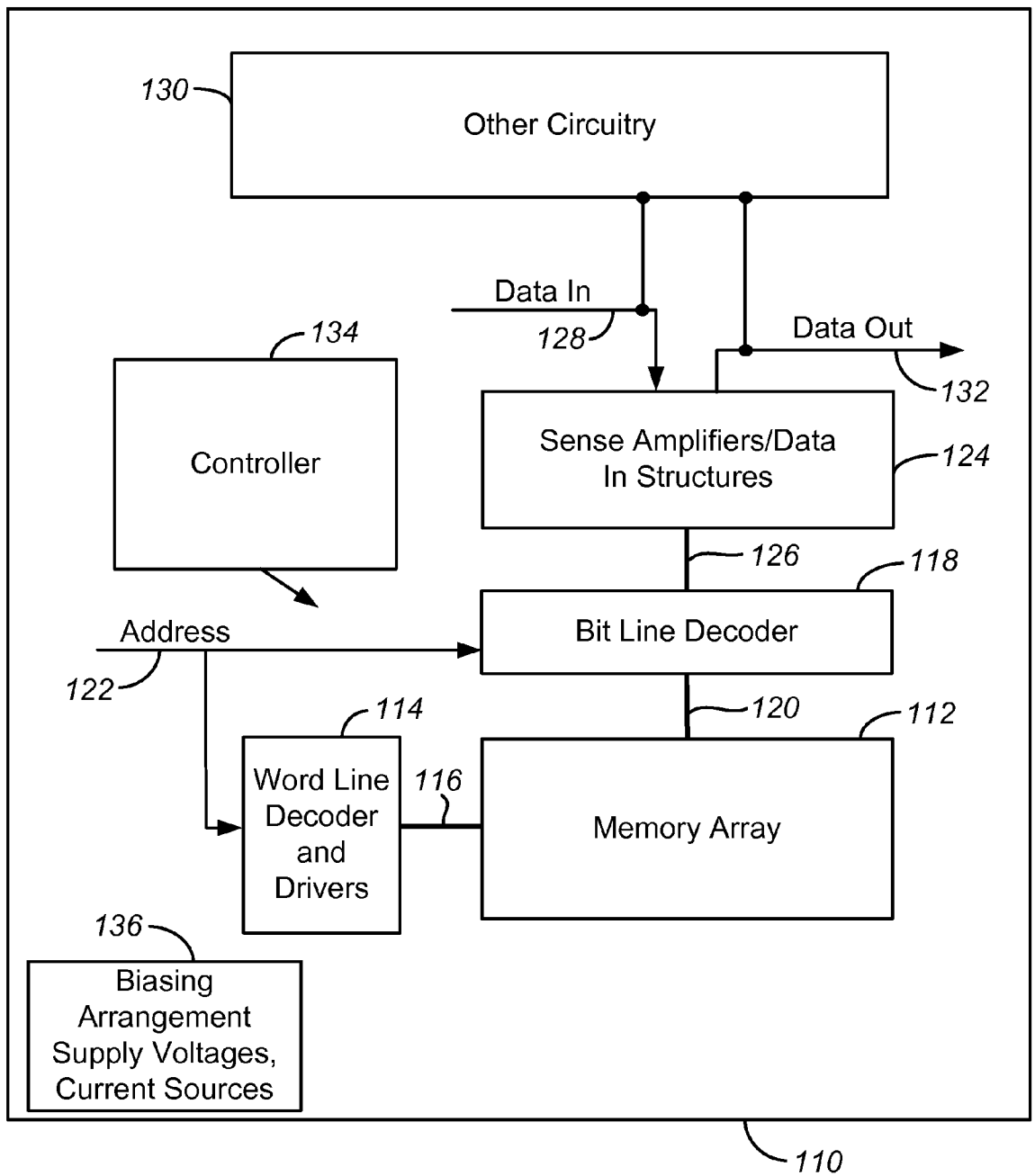
FIG. 9 is a simplified block diagram of an integrated circuit including memory devices including memory cells having a dielectric element between the bottom and top memory elements with a conduction path formed through the dielectric element.

FIG. 9 is a simplified block diagram of an integrated circuit 110 including a memory array 112 implemented using memory devices 10. A word line decoder 114 having read, set and reset modes is coupled to and in electrical communication with a plurality of word lines 116 arranged along rows in the memory array 112. A bit line (column) decoder 118 is in electrical communication with a plurality of bit lines 120 arranged along columns in the array 112 for reading, setting, and resetting memory cell 16 in array 112. Addresses are supplied on bus 122 to word line decoder and drivers 114 and bit line decoder 118. Sense amplifiers and data-in structures in block 124, including voltage and/or current sources for the read, set, and reset modes are coupled to bit line decoder 118 via data bus 126. Data is supplied via a data-in line 128 from input/output ports on integrated circuit 110, or from other data sources internal or external to integrated circuit 110, to data-in structures in block 124. Other circuitry 130 may be included on integrated circuit 110, such as a general purpose processor or special purpose application circuitry, or a combination of modules providing system-on-a-chip functionality supported by array 112. Data is supplied via a data-out line 132 from the sense amplifiers in block 124 to input/output ports on integrated circuit 110, or to other data destinations internal or external to integrated circuit 110.

A controller 134 implemented in this example, using a bias arrangement state machine, controls the application of bias arrangement supply voltages and current sources 136, such as read, program, erase, erase verify and program verify voltages and/or currents. Controller 134 can also be used to control the electrical breakdown procedure carried out by applying electrical pulse through pillars 45 of material to form conduction paths 24 thereby creating memory devices 10. Controller 134 may be implemented using special-purpose logic circuitry as known in the art. In alternative embodiments, controller 134 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 134.

Embodiments of the memory cells described herein include phase change based memory materials, including chalcogenide based materials and other materials, for the memory element. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a phase change random access memory (PCRAM) described herein is $Ge_2Sb_2Te_5$.

Other programmable resistive memory materials may be used in other embodiments of the invention, including $N_2$ doped GST, GexSby, or other material that uses different crystal phase changes to determine resistance; $Pr_xCa_yMnO_3$, $Pr_xSr_yMnO_3$, $ZrO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has a bistable or multi-stable resistance state controlled by an electrical pulse.

An exemplary method for forming chalcogenide material uses PVD-sputtering or magnetron-sputtering method with source gas(es) of Ar, N2, and/or He, etc. at the pressure of 1 mTorr~100 mTorr. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 3 nm can have a phase change characterization so that the material exhibits at least two stable resistance states.

The above descriptions may have used terms such as above, below, top, bottom, over, under, et cetera. These terms are used in the description and the claims to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

Any and all patents, patent applications and printed publications referred to above are incorporated by reference.

What is claimed is:

1. A memory device comprising:
    a bottom electrode structure;
    a memory cell, over the bottom electrode structure, comprising:
        a bottom memory element comprising a bottom memory material switchable between electrical properties states by the application of energy;
        a top memory element comprising a top memory material switchable between electrical properties states by the application of energy;
        at least one of the bottom and top memory elements comprising a phase change material;
        a dielectric element, between the bottom and top memory elements, comprising a conduction path formed therethrough connecting the top and bottom memory elements; and
        the portion of the dielectric element surrounding the conduction path having an electrical resistance greater than the electrical resistance of the conduction path; and
    a top electrode structure over the top memory element of the memory cell.

2. The memory device according to claim 1, wherein at least one of the bottom and top memory elements comprises a chalcogenide material.

3. The memory device according to claim 1, wherein each of the top and bottom memory elements comprise GST and the dielectric element comprises $Ge_xO_y$ or SiOx.

4. The memory device according to claim 1, wherein the dielectric element has a thickness of about 1 to 30 nm.

5. The memory device according to claim 1, wherein the top electrode structure comprised a top electrode and a cap layer between the top electrode and the top memory element.

6. The memory device according to claim 1, further comprising a passivation element surrounding the memory cell.

7. The memory device according to claim 1, wherein the dielectric element has an outer edge and a central portion, the outer edge being thicker than the central portion.

8. A method for making a memory device comprising:
selecting a phase change memory material for at least one of a top memory material element and for a bottom memory material element;
forming bottom and top electrode structures and a memory cell therebetween, the memory cell comprising the bottom and top memory material elements and an dielectric element therebetween; and
performing an electrical breakdown procedure on the dielectric element by applying an electrical pulse through the memory cell to form a conduction path through the dielectric element.

9. The method according to claim 8, further comprising forming the dielectric element with a thickness of about 1 to 30 nm.

10. The method according to claim 8, further comprising using GST for the bottom and top memory material elements.

11. The method according to claim 8, further comprising selecting different GST materials having different transition properties for use as the bottom and top memory material elements.

12. The method according to claim 8, further comprising forming a passivation element surrounding the memory cell.

13. The method according to claim 12, wherein the passivation element forming step comprises oxidizing an outer surface of the memory cell.

14. The method according to claim 13, wherein the dielectric element has an outer edge and a central portion, and the oxidizing step comprises enlarging the outer edge so that the outer edge is thicker than the central portion.

15. An integrated circuit comprising:
a memory array comprising a plurality of memory devices, at least some of the memory devices comprising:
a memory cell comprising:
a bottom memory element switchable between different electrical properties states;
a top memory element switchable between different electrical properties states;
at least one of the bottom and top memory elements comprising a phase change material; and
a dielectric element between the bottom and top memory elements; and
control circuitry adapted to apply an electrical pulse through the memory cell during an electrical breakdown procedure to form a conduction path through the dielectric element connecting the top and bottom memory elements of said at least some of the memory devices, the portion of the dielectric element surrounding the conduction path having an electrical resistance greater than the electrical resistance of the conduction path.

16. The integrated circuit according to claim 15, wherein the bottom and top memory elements comprise different memory materials.

17. The integrated circuit according to claim 15, wherein the at least of some of the memory devices further comprise a passivation element surrounding the memory cell.

18. The integrated circuit according to claim 15, wherein the conduction path is an electrical-pulse-formed conduction path.

19. The integrated circuit according to claim 15, wherein the dielectric element has an outer edge and a central portion, the outer edge being thicker than the central portion.

* * * * *